(12) United States Patent
Pinarbasi

(10) Patent No.: US 7,436,637 B2
(45) Date of Patent: Oct. 14, 2008

(54) MAGNETORESISTIVE SENSOR HAVING AN IMPROVED PINNING STRUCTURE

(75) Inventor: Mustafa Michael Pinarbasi, Morgan Hill, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 398 days.

(21) Appl. No.: 11/244,675

(22) Filed: Oct. 5, 2005

(65) Prior Publication Data

US 2007/0076331 A1 Apr. 5, 2007

(51) Int. Cl.
*G11B 5/33* (2006.01)
(52) U.S. Cl. .................................. 360/324.11
(58) Field of Classification Search .............. None
See application file for complete search history.

(56) References Cited

U.S. PATENT DOCUMENTS

| | | | | |
|---|---|---|---|---|
| 5,428,491 A * | 6/1995 | Smith | ..... | 360/327.31 |
| 5,818,685 A * | 10/1998 | Thayamballi et al. | ..... | 360/324 |
| 6,005,753 A * | 12/1999 | Fontana et al. | ..... | 360/324.2 |
| 6,256,176 B1 * | 7/2001 | Mao et al. | ..... | 360/324.1 |
| 6,667,862 B2 * | 12/2003 | Zhu | ..... | 360/324.12 |
| 6,724,583 B2 * | 4/2004 | Seigler et al. | ..... | 360/324.12 |
| 6,807,032 B1 * | 10/2004 | Seigler et al. | ..... | 360/319 |
| 7,019,371 B2 * | 3/2006 | Seigler | ..... | 257/425 |
| 7,035,062 B1 * | 4/2006 | Mao et al. | ..... | 360/324.2 |
| 7,050,274 B2 * | 5/2006 | Seigler et al. | ..... | 360/324.11 |
| 7,177,122 B2 * | 2/2007 | Hou et al. | ..... | 360/324.12 |
| 7,220,499 B2 * | 5/2007 | Saito et al. | ..... | 428/811.5 |

* cited by examiner

*Primary Examiner*—Angel A Castro
(74) *Attorney, Agent, or Firm*—Zilka-Kotab, PC

(57) ABSTRACT

A magnetoresistive sensor having a hard magnetic layer extending from the stripe height of the pinned layer to assist in pinning the pinned layer. The pinned layer extends beyond the stripe height of the free layer so that the back stripe height edge of the pinned layer is significantly beyond the stripe height edge of the free layer. The pinned layer is preferably constructed to have a net magnetic moment such that magnetostatic coupling between the hard magnetic layer and the pinned layer pins the moment of the layers. The hard magnetic layer can be used in addition to or in lieu of an AFM pinning layer.

18 Claims, 5 Drawing Sheets

MAGNETORESISTIVE SENSOR HAVING AN IMPROVED PINNING STRUCTURE

FIELD OF THE INVENTION

The present invention relates to magnetoresistive sensors and more particularly to a magnetoresistive sensor having an improved pinning structure that provides robust pinning even in the event of a heat spike such as might be caused by a head disk contact or an electrostatic discharge.

BACKGROUND OF THE INVENTION

The heart of a computer is an assembly that is referred to as a magnetic disk drive. The magnetic disk drive includes a rotating magnetic disk, write and read heads that are suspended by a suspension arm adjacent to a surface of the rotating magnetic disk and an actuator that swings the suspension arm to place the read and write heads over selected circular tracks on the rotating disk. The read and write heads are directly located on a slider that has an air bearing surface (ABS). The suspension arm biases the slider into contact with the surface of the disk when the disk is not rotating but, when the disk rotates, air is swirled by the rotating disk. When the slider rides on the air bearing, the write and read heads are employed for writing magnetic impressions to and reading magnetic impressions from the rotating disk. The read and write heads are connected to processing circuitry that operates according to a computer program to implement the writing and reading functions.

The write head includes a coil layer embedded in first, second and third insulation layers (insulation stack), the insulation stack being sandwiched between first and second pole piece layers. A gap is formed between the first and second pole piece layers by a gap layer at an air bearing surface (ABS) of the write head and the pole piece layers are connected at a back gap. Current conducted to the coil layer induces a magnetic flux in the pole pieces which causes a magnetic field to fringe out at a write gap at the ABS for the purpose of writing the aforementioned magnetic impressions in tracks on the moving media, such as in circular tracks on the aforementioned rotating disk.

In recent read head designs a spin valve sensor, also referred to as a giant magnetoresistive (GMR) sensor, has been employed for sensing magnetic fields from the rotating magnetic disk. The sensor includes a nonmagnetic conductive layer, hereinafter referred to as a spacer layer, sandwiched between first and second ferromagnetic layers, hereinafter referred to as a pinned layer and a free layer. First and second leads are connected to the spin valve sensor for conducting a sense current therethrough. The magnetization of the pinned layer is pinned perpendicular to the air bearing surface (ABS) and the magnetic moment of the free layer is located parallel to the ABS, but free to rotate in response to external magnetic fields. The magnetization of the pinned layer is typically pinned by exchange coupling with an antiferromagnetic layer.

The thickness of the spacer layer is chosen to be less than the mean free path of conduction electrons through the sensor. With this arrangement, a portion of the conduction electrons is scattered by the interfaces of the spacer layer with each of the pinned and free layers. When the magnetizations of the pinned and free layers are parallel with respect to one another, scattering is minimal and when the magnetizations of the pinned and free layer are antiparallel, scattering is maximized. Changes in scattering alter the resistance of the spin valve sensor in proportion to $\cos\theta$, where $\theta$ is the angle between the magnetizations of the pinned and free layers. In a read mode the resistance of the spin valve sensor changes proportionally to the magnitudes of the magnetic fields from the rotating disk. When a sense current is conducted through the spin valve sensor, resistance changes cause potential changes that are detected and processed as playback signals.

When a spin valve sensor employs a single pinned layer it is referred to as a simple spin valve. When a spin valve employs an antiparallel (AP) pinned layer it is referred to as an AP pinned spin valve. An AP spin valve includes first and second magnetic layers separated by a thin non-magnetic coupling layer such as Ru. The thickness of the spacer layer is chosen so as to antiparallel couple the magnetizations of the ferromagnetic layers of the pinned layer. A spin valve is also known as a top or bottom spin valve depending upon whether the pinning layer is at the top (formed after the free layer) or at the bottom (before the free layer).

The spin valve sensor is located between first and second nonmagnetic electrically insulating read gap layers and the first and second read gap layers are located between ferromagnetic first and second shield layers. In a merged magnetic head a single ferromagnetic layer functions as the second shield layer of the read head and as the first pole piece layer of the write head. In a piggyback head the second shield layer and the first pole piece layer are separate layers.

Magnetization of the pinned layer is usually fixed by exchange coupling one of the ferromagnetic layers (AP1) with a layer of antiferromagnetic material such as PtMn. While an antiferromagnetic (AFM) material such as PtMn does not in and of itself have a magnetization, when exchange coupled with a magnetic material, it can strongly pin the magnetization of the ferromagnetic layer. With the ever increasing demand for improved data rate and data capacity, engineers and scientists have been under constant pressure to develop ever smaller magnetoresistive sensors. The various dimensions of a sensor scale together, so as the track width of a sensor decreases, the gap thickness and stripe height decrease accordingly.

A challenge that arises as a result of such ever shrinking sensor dimensions, is that the traditional pinning mechanisms no longer adequately pin the magnetic moments of the pinned layer. As the size of the sensor decreases, stability degrades. This decreased pinning robustness leaves the pinned layer very vulnerable to high temperature events such as head disk contact or electrostatic discharge. Such events can cause a momentary loss of pinning by raising the AFM above its blocking temperature, resulting in flipping of the magnetic moment of the pinned layer. This, of course, renders the sensor unusable.

Therefore, there is a strong felt need for a pinning mechanism that can be used in conjunction with or in lieu of traditional AFM pinning of a pinned layer in a magnetoresistive sensor. Such a pinning mechanism would preferably maintain pinned layer moment pinning even in the event of a high temperature event such as a head disk contact or an electrostatic discharge.

SUMMARY OF THE INVENTION

The present invention provides a magnetoresistive sensor having a hard magnetic layer disposed along the stripe height edge of the pinned layer. Magnetostatic coupling between the hard magnetic layer and the pinned layer pins the magnetic moment of the back edge of the pinned layer.

The pinned layer preferably extends beyond the stripe height of the free layer so that the hard magnetic layer used to pin the pinned layer is sufficiently removed from the free layer that it will not affect the magnetization of the free layer. The hard magnetic layer used to pin the pinned layer is preferably constructed of a magnetic material having a coercivity that is different from that of the hard bias layers used to bias the free layer. In this way the hard magnetic pinning layer and the hard bias layers can be set in orthogonal directions by first setting the layer having the higher coercivity and then setting the lower coercivity layer.

The magnetic pinning field provided by the hard magnetic pinning layer is advantageously unaffected by high temperature events (heat spikes) such as from head disk contact or electrostatic discharge. In addition, the hard magnetic pinning layer can be used in lieu of or in addition to an AFM layer. If used in addition to an AFM layer, the hard magnetic layer will maintain the orientation of the moments of the pinned layer in a desired direction in the event of a heat spike, wherein AFM pinning may be momentarily lost. When the head cools back below the blocking temperature of the AFM material, the moments will still be oriented as desired, leaving the head undamaged by the heat spike.

These and other features and advantages of the invention will be apparent upon reading of the following detailed description of preferred embodiments taken in conjunction with the Figures in which like reference numerals indicate like elements throughout.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

DETAILED DESCRIPTION OF THE PREFERRED EMBODIMENTS

The following description is of the best embodiments presently contemplated for carrying out this invention. This description is made for the purpose of illustrating the general principles of this invention and is not meant to limit the inventive concepts claimed herein.

Figure 1:
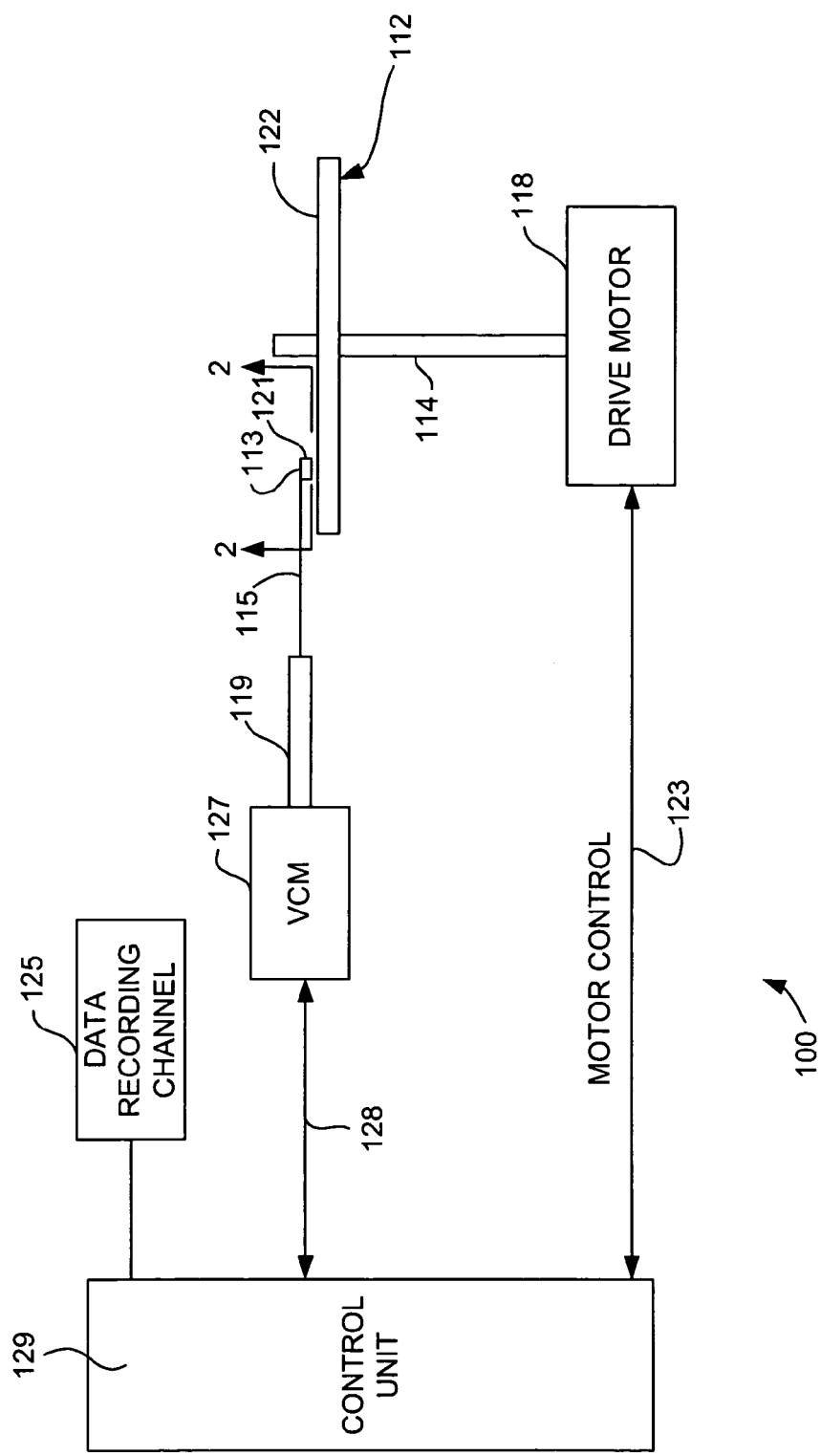
FIG. 1 is a schematic illustration of a disk drive system in which the invention might be embodied.

Referring now to FIG. 1, there is shown a disk drive 100 embodying this invention. As shown in FIG. 1, at least one rotatable magnetic disk 112 is supported on a spindle 114 and rotated by a disk drive motor 118. The magnetic recording on each disk is in the form of annular patterns of concentric data tracks (not shown) on the magnetic disk 112.

At least one slider 113 is positioned near the magnetic disk 112, each slider 113 supporting one or more magnetic head assemblies 121. As the magnetic disk rotates, slider 113 moves radially in and out over the disk surface 122 so that the magnetic head assembly 121 may access different tracks of the magnetic disk where desired data are written. Each slider 113 is attached to an actuator arm 119 by way of a suspension 115. The suspension 115 provides a slight spring force which biases slider 113 against the disk surface 122. Each actuator arm 119 is attached to an actuator means 127. The actuator means 127 as shown in FIG. 1 may be a voice coil motor (VCM). The VCM comprises a coil movable within a fixed magnetic field, the direction and speed of the coil movements being controlled by the motor current signals supplied by controller 129.

During operation of the disk storage system, the rotation of the magnetic disk 112 generates an air bearing between the slider 113 and the disk surface 122 which exerts an upward force or lift on the slider. The air bearing thus counter-balances the slight spring force of suspension 115 and supports slider 113 off and slightly above the disk surface by a small, substantially constant spacing during normal operation.

The various components of the disk storage system are controlled in operation by control signals generated by control unit 129, such as access control signals and internal clock signals. Typically, the control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Write and read signals are communicated to and from write and read heads 121 by way of recording channel 125.

Figure 2:
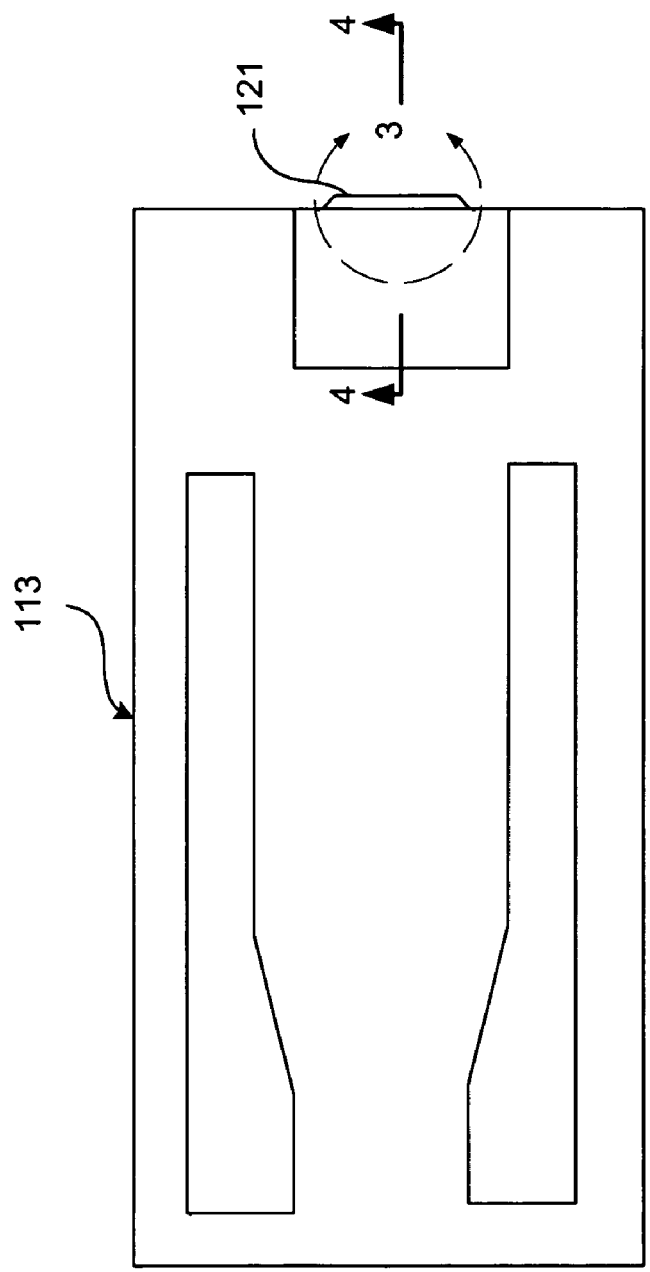
FIG. 2 is an ABS view of a slider illustrating the location of a magnetic head thereon.

With reference to FIG. 2, the orientation of the magnetic head 121 in a slider 113 can be seen in more detail. FIG. 2 is an ABS view of the slider 113, and as can be seen the magnetic head including an inductive write head and a read sensor, is located at a trailing edge of the slider. The above description of a typical magnetic disk storage system, and the accompanying illustration of FIG. 1 are for representation purposes only. It should be apparent that disk storage systems may contain a large number of disks and actuators, and each actuator may support a number of sliders.

Figure 3:
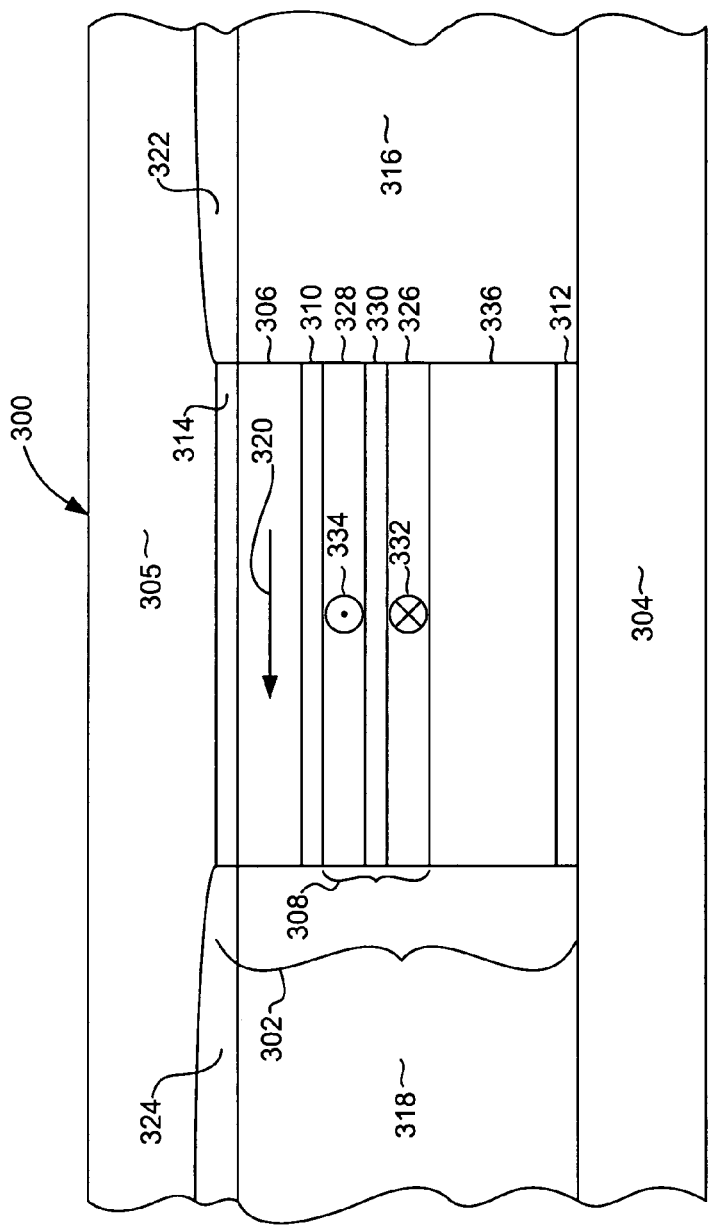
FIG. 3 is an enlarged ABS view taken from circle 3 of FIG. 2.

With reference now to FIG. 3, a magnetoresistive sensor 300 according to an embodiment of the invention includes a magnetoresistive sensor element or sensor stack 302, sandwiched between first and second gap layers 304, 305. The first and second gap layers are constructed of a non-magnetic, electrically insulating material such as alumina ($Al_2O_3$). The sensor 300 has an air bearing surface (ABS). However, as fly heights are rapidly deceasing to near the point of contact with the magnetic medium, the term ABS should be understood herein to refer to a medium facing surface of the sensor 300, whether or not such surface actually rides on air or is actually in contact with the medium during use.

The sensor stack includes a magnetic pinned layer structure 308, a magnetic free layer structure 306 and a non-magnetic, electrically conductive spacer layer 310 such as Cu sandwiched between the free and pinned layers 306, 308. It should be pointed out that although the invention is being described in terms of a GMR sensor having an electrically conductive spacer layer 310 between the free and pinned layers 306, 308, it could also be embodied in a tunnel valve sensor, in which case a non-magnetic, electrically insulating barrier layer would be sandwiched between the free and pinned layers 306, 308 rather than the electrically conductive spacer 310. The free layer 306 is constructed of a magnetic material and may be constructed of Co, CoFe, NiFe or a combination of layers of these materials.

A seed layer 312 may be provided at the bottom of the sensor stack to initiate a desired grain structure in the above deposited sensor layers. A capping layer 314 such as Ta may be provided at that top of the sensor stack 302 to protect the layers of the sensor 302 from damage during manufacture.

With reference to FIG. 3, first and second hard magnetic bias layers 316, 318 may be provided at either lateral side of the sensor stack 302 to provide a bias field to bias the magnetic moment 320 of the free layer 306 in a direction parallel to the ABS as shown. The hard bias layers 316, 318 can be constructed of various hard magnetic materials and are preferably constructed of CoPt or CoPtCr. In addition, first and second electrically conductive leads 322, 324 are provided at either side of the sensor stack 302, formed over the hard bias layers 316, 318 in order to conduct electrical sense current to the sensor stack 302. The leads 322, 324 may be constructed of, for example, Au, Rh, Cu or another electrically conductive material.

Figure 4:
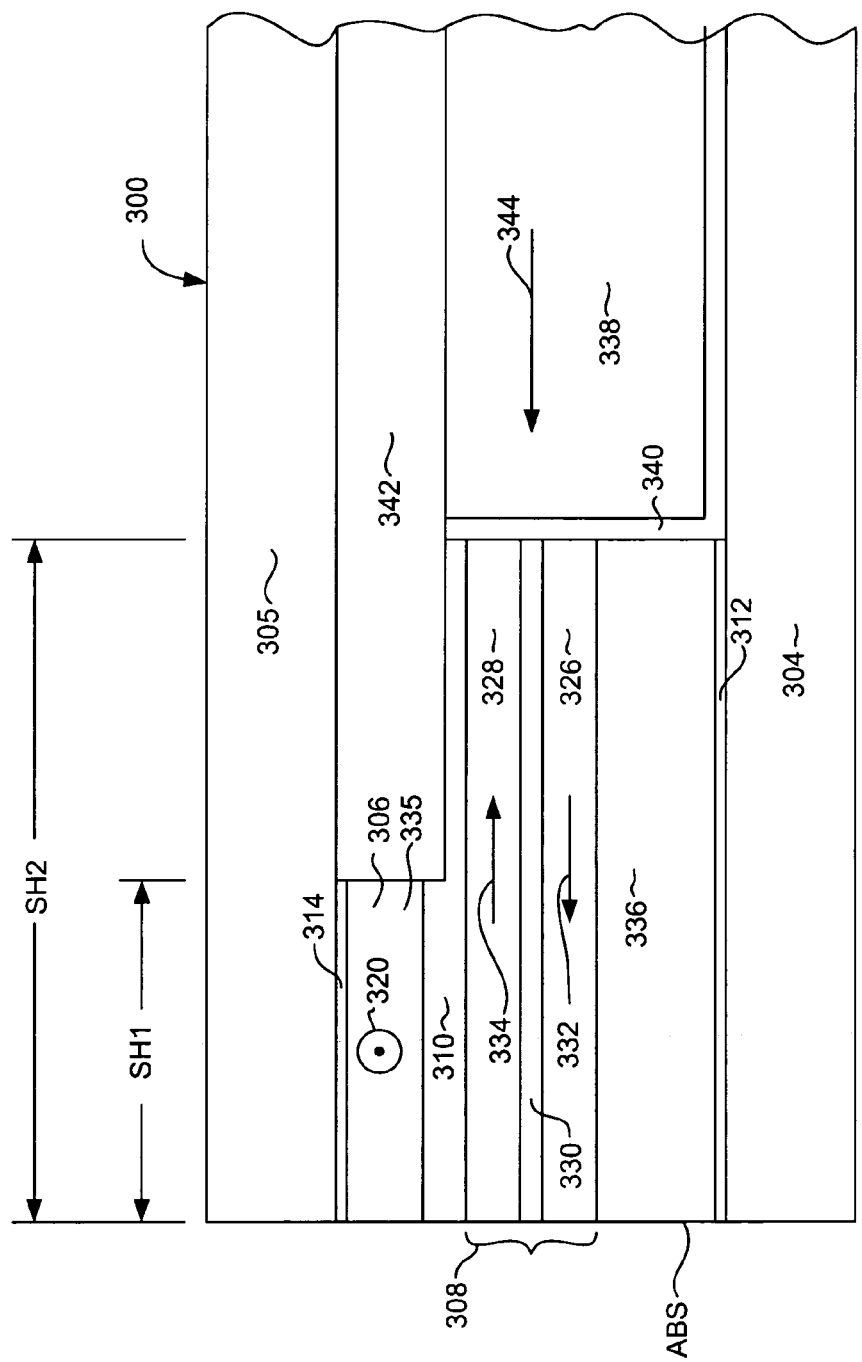
FIG. 4 is a cross sectional view of a magnetic sensor according to an embodiment of the present invention taken from line 4-4 of FIG. 2.

With reference to FIGS. 3 and 4, the pinned layer structure 308 includes a first magnetic layer AP1 326 a second magnetic layer AP2 328 and a non-magnetic antiparallel coupling layer 330 such as Ru sandwiched between the AP1 and AP2 layers. The AP1 and AP2 layers have magnetic moments 332, 334 that are pinned antiparallel to one another and perpendicular to the ABS. Pinning is maintained in part by an AFM layer 336 that is exchange coupled with the AP1 layer 326. An additional pinning mechanism will be described herein below with reference to FIG. 4.

With reference now to FIG. 4, the sensor 300 has a first stripe height SH1 defined by the back edge 335 of the free layer 306. This first stripe height, measured from the ABS defines an active area of the sensor 300. The pinned layer 308 extends beyond the active area of the sensor to a second stripe height SH2, also measured from the ABS. SH2 is greater than SH1, and is preferably at least 2 times or several times SH1. In other words, the height of the pinned layer 308 as measured from the ABS is preferably at least twice the height of the free layer 306 and may be several (3 or more) times the height of the free layer. Although shown as a horizontal dimension in FIG. 4, those skilled in the art will recognize that the distance from the ABS is generally referred to in terms of "height". The AFM layer 336 also preferably extends at least to the second stripe height SH2 although it may extend further.

With reference still to FIG. 4, a hard magnetic pinning assist layer 338 is provided behind the stripe height edge of the pinned layer structure 308. This hard magnetic pinning assist layer 338 may be constructed upon a seed layer 340. This seed layer 340 may be an amorphous material such as alumina, or may be a crystalline material, and may be either electrically conductive or electrically insulating. An amorphous material such as alumina is a good candidate for use as the seed layer 340, because it does not impart its own crystalline structure onto the pinning assist layer 338 formed thereon. An insulating fill layer 342 may be provided above the hard magnetic pinning assist layer 338 and the second gap layer, and preferably extends to the free layer at SH1, filling the space between the pinned layer structure 308 and the second gap layer 305 over the extended portion of the pinned layer 308.

It should be pointed out that, although the sensor 300 is being described in terms of a current in plane (CIP) sensor, the invention could also be practiced in a current perpendicular to plane (CPP) sensor, in which case the non-magnetic, electrically insulating gap layers 304, 305 would be replaced with magnetic, electrically conducting lead/shield layers. Whether the sensor is a CPP or a CIP sensor, the fill layer 342 can be constructed of various non-magnetic, electrically insulating materials such as aluminum oxide (alumina).

The hard magnetic pinning assist layer 338 has a fixed magnetic moment 344 oriented perpendicular to the ABS. This magnetic moment 344 is magnetostatically coupled with the pinned layer 308. The pinned layer structure 308 is constructed so that one of the magnetic AP1, AP2 layers 326, 328 has a larger magnetic thickness than the other. Magnetic thickness can be defined as the physical thickness of a material multiplied by the magnetic moment of the material. This means that the pinned layer structure 308 has a net magnetic moment, since the magnetic moments of the two layers 326, 328 do not cancel each other out (ie. do not sum to zero).

The net magnetic moment between the AP1 and AP2 layers 326, 328 magnetostatically interacts with the moment 344 of the hard magnetic pinning assist layer 338 to strongly pin the moments 334, 332 of the pinned layer 308. The net moment of the pinned layer 308 can be analogized to a lever on which the moment 344 of the hard magnetic layer 338 can act. The magnetic thicknesses of the AP1 and AP2 layers 326, 328 are preferably chosen so as to find a balance between providing strong antiparallel coupling and providing a sufficient net magnetic moment to allow the magnetostatic coupling with the hard magnetic layer 338 to provide strong pinning assistance. The AP1 and AP2 layers can be constructed of a magnetic material having a positive magnetostriction, such as for example CoFe. This positive magnetostriction further assists pinning by generating a stress induced magnetic anisotropy in the pinned layer. As can be seen with reference to FIG. 4, the hard magnetic pinning assist layer 338 is separated from the free layer 306 by a substantial distance (a little greater than SH2-SH1). This separation keeps the moment 344 of the hard magnetic layer 338 from significantly affecting the biasing of the magnetic moment 320 of the free layer.

The hard magnetic pinning assist layer 338 is preferably constructed of a material having a significantly higher magnetic moment than that of the hard bias layers 316, 318 (FIG. 3) used to bias the free layer 306. This allows the hard magnetic pinning assist layer 338 and the hard bias layers 316, 318 to be set in different, perpendicular directions. For example, the hard magnetic pinning assist layer can be constructed of CoPt with a CrMo seed which has a coercivity of about 2200 Oe. A seed layer, such as alumina, can also be provided under the CrMo. The bias layers 316, 318 can be constructed of, for example a CoPtCr alloy, with a Cr seed, which has a coercivity of 1400 Oe. It is desirable that the pinning assist layer 338, and the hard bias layer 316, 318 be constructed of different materials, with sufficiently different coercivities, to facilitate setting their magnetizations in different directions. For example, the moment 344 of the pinning assist layer 338 can first be set by applying a magnetic field greater than the coercivity of the pinning assist layer 338 (for example 2200 Oe for CoPt with 20 percent Pt). Then, the moments of the hard bias layers 316, 318 can be set by applying a magnetic field greater than the coercivity of the hard bias layers 316, 318 (1400 Oe in the case of CoPtCr). The setting of the hard bias moments, then, will not affect the moment of the pinning assist layer 344.

Figure 5:
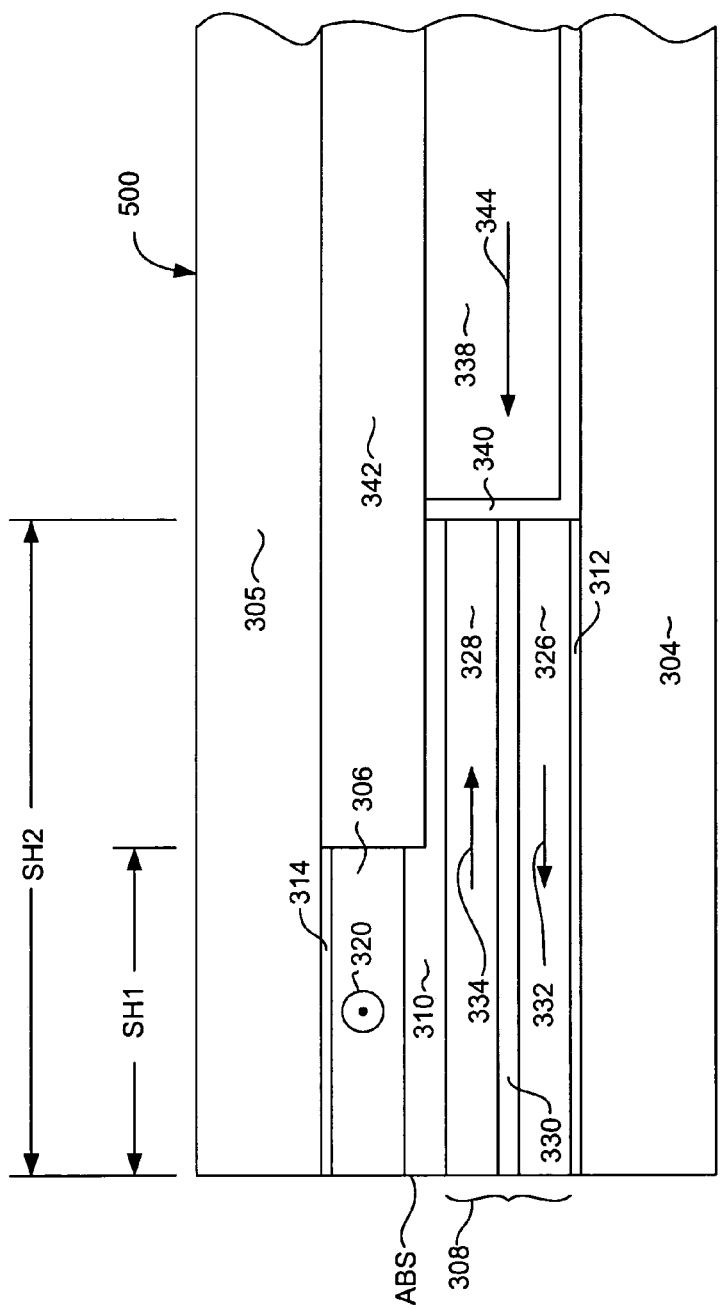
FIG. 5 is a cross sectional view, similar to that of FIG. 4, of a sensor according to an alternate embodiment of the invention.

With reference to FIG. 5, in an alternate embodiment 500 of the invention the AFM layer 336 can be eliminated altogether. In this case, pinning will be maintained by the hard magnetic layer 338. This embodiment provides slightly decreased pinning robustness, but does provide significantly reduced gap thickness. Since AFM layers must be very thick in order to function antiferromagnetically, a gap thickness reduction of 60 to 150 Angstroms, can be realized by eliminating the AFM layer and relying on the hard magnetic layer 338, AP coupling of the pinned layer 308 and stress induced anisotropy (due to magnetostriction of AP1, AP2 layers 328, 326) to maintain pinning.

While various embodiments have been described above, it should be understood that they have been presented by way of example only, and not limitation. Other embodiments falling within the scope of the invention may also become apparent to those skilled in the art. Thus, the breadth and scope of the invention should not be limited by any of the above-described exemplary embodiments, but should be defined only in accordance with the following claims and their equivalents.

What is claimed is:

1. A magnetoresistive sensor, comprising:
    a magnetic free layer, having an edge defining a first stripe height measured from an air bearing surface (ABS);
    a magnetic pinned layer structure, the pinned layer structure extending beyond the first stripe height and extending to a stripe height edge that defines a second stripe height measured from the ABS; and
    a hard magnetic material that initiates adjacent to the stripe height edge of the pinned layer and extends away from the ABS.

2. A sensor as in claim 1 wherein the second stripe height is greater than the first stripe height.

3. A sensor as in claim 1 wherein the second stripe height is at least two times the first stripe height.

4. A sensor as in claim 1 wherein the hard magnetic layer is magnetostatically coupled with the stripe height edge of the pinned layer.

5. A sensor as in claim 1 wherein the hard magnetic layer comprises a layer of CoPt formed over a CrMo seed layer.

6. A sensor as in claim 1 further comprising first and second hard bias layers extending laterally from first and second lateral sides of the free layer; and wherein the hard bias layers have each have a coercivity that is less than a coercivity of the hard magnetic layer formed adjacent to the stripe height edge of the pinned layer.

7. A sensor as in claim 1 further comprising first and second hard bias layers extending laterally from first and second lateral sides of the free layer; and wherein the hard bias layers comprise CoPtCr with a Cr seed, and the hard magnetic layer formed adjacent to the stripe height edge of the pinned layer comprises a layer of CoPt formed on a seed CrMo seed layer.

8. A sensor as in claim 1 wherein the hard magnetic layer comprises a layer of CoPt formed on a CrMo seed layer.

9. A sensor as in claim 1 wherein the pinned layer structure has a net magnetic moment.

10. A magnetoresistive sensor having an air bearing surface (ABS), comprising:
    a magnetic free layer having a first stripe height measured from the ABS the defines an active area of the sensor;
    a pinned layer structure that extends beyond the first stripe height to terminate at an edge that defines a second stripe height that is larger than the first stripe height;
    a non-magnetic spacer layer sandwiched between the free layer and the pinned layer;
    a layer of antiferromagnetic material (AFM) layer exchange coupled with the pinned layer structure and disposed opposite the spacer layer; and
    a hard magnetic pinning assist layer formed adjacent to the edge of the pinned layer.

11. A sensor as in claim 10 wherein the AFM layer terminates at an edge located at the second stripe height.

12. A sensor as in claim 10 further comprising first and second non-magnetic, electrically insulating gap layers, the free layer, pinned layer, spacer layer, AFM layer, and hard magnetic pinning assist being located between the first and second gap layers.

13. A sensor as in claim 10 further comprising:
    first and second magnetic, electrically conductive shield layers, the free layer, pinned layer, spacer layer, AFM layer, and hard magnetic pinning assist layer being located between the first and second shield layers; and
    a non-magnetic, electrically insulating fill layer disposed between the hard magnetic pinning assist layer and the second shield.

14. A sensor as in claim 10 wherein the spacer is a non-magnetic electrically conductive spacer layer.

15. A sensor as in claim 10 wherein the spacer layer is a thin, non-magnetic, electrically insulating barrier layer.

16. A sensor as in claim 10 further comprising first and second hard bias layers extending laterally from the free layer, and wherein the hard magnetic pinning assist layer has a coercivity that is different from a coercivity of the hard bias layers.

17. A sensor as in claim 10 wherein the hard magnetic pinning layer comprises a CoPt formed on a CrMo seed layer.

18. A sensor as in claim 10 wherein the pinned layer structure has a net magnetic moment.

* * * * *